US007867806B2

(12) United States Patent
Graydon et al.

(10) Patent No.: US 7,867,806 B2
(45) Date of Patent: Jan. 11, 2011

(54) ELECTRONIC COMPONENT STRUCTURE AND METHOD OF MAKING

(75) Inventors: Bhret Graydon, San Jose, CA (US); William Kuang-Hue Shu, Sunnyvale, CA (US)

(73) Assignee: Flextronics AP, LLC, Broomfield, CO (US)

( * ) Notice: Subject to any disclaimer, the term of this patent is extended or adjusted under 35 U.S.C. 154(b) by 126 days.

(21) Appl. No.: 11/752,181

(22) Filed: May 22, 2007

(65) Prior Publication Data
US 2008/0206927 A1 Aug. 28, 2008

Related U.S. Application Data

(60) Provisional application No. 60/891,655, filed on Feb. 26, 2007.

(51) Int. Cl.
*H01L 21/00* (2006.01)
*H01L 21/50* (2006.01)
*H01L 33/00* (2010.01)

(52) U.S. Cl. .......................... 438/64; 438/67; 438/107; 257/E21.499; 257/E33.057

(58) Field of Classification Search ......... 438/106–107, 438/109, 64–66, 69, 73, 57, 59, 60, 67, 75
See application file for complete search history.

(56) References Cited

U.S. PATENT DOCUMENTS

| 5,608,237 | A | * | 3/1997 | Aizawa et al. | 257/132 |
| 5,767,564 | A | * | 6/1998 | Kunimatsu et al. | 257/532 |
| 6,611,434 | B1 | * | 8/2003 | Lo et al. | 361/760 |
| 6,873,228 | B1 | * | 3/2005 | Barratt | 333/185 |
| 2003/0203537 | A1 | | 10/2003 | Koopmans | |
| 2004/0245649 | A1 | * | 12/2004 | Imaoka | 257/774 |
| 2004/0257780 | A1 | * | 12/2004 | Hester et al. | 361/782 |
| 2005/0173783 | A1 | | 8/2005 | Chow et al. | |
| 2006/0094160 | A1 | | 5/2006 | Akram | |
| 2006/0246622 | A1 | * | 11/2006 | Kim et al. | 438/106 |

* cited by examiner

*Primary Examiner*—Savitri Mulpuri
*Assistant Examiner*—Calvin Choi
(74) *Attorney, Agent, or Firm*—Robert G. Crouch; Karl A. Dierenbach; Marsh Fischmann & Breyfogle LLP

(57) ABSTRACT

An external component, typically a surface mount passive, is attached to a semiconductor die. In some embodiments the passive is placed directly over exposed pads on the semiconductor die and attached using conductive tape or conductive epoxy. In some embodiments the passive is attached to the semiconductor die using non-conductive adhesive and wire bonded to bond pads on the semiconductor die and/or to pads on a substrate to which the semiconductor die is attached.

11 Claims, 4 Drawing Sheets

ELECTRONIC COMPONENT STRUCTURE AND METHOD OF MAKING

CROSS REFERENCE TO RELATED APPLICATIONS

This application claims priority from U.S. Provisional Application No. 60/891,655 entitled "ATTACHING PASSIVE COMPONENTS TO A SEMICONDUCTOR DIE," filed on 26 Feb. 2007, by B. Graydon and W. Shu, which is incorporated herein by reference.

BACKGROUND

In the manufacture of electronic products, great value is placed upon cost savings, physical size and weight savings, and electrical performance. Amongst other factors, the cost of an electronic product or subsystem is related to the area of a printed circuit board ("PCB") or substrate ("printed circuit board", "PCB", and "substrate" are used interchangeably throughout this disclosure) upon which components are mounted, whether for electrical connection or mechanical operation. The size and weight of the end product being manufactured are related to the number and size of the one or more PCBs forming the product or subsystem. Electrical performance is related to the length of signal lines between components, the distance between a component and the power source for the component, the distance between the power and ground pads on a component and the noise filtering components to the power and ground inputs, and other factors.

Noise filtering of power and ground (often termed "decoupling") of an electronic component in the current art requires incremental substrate or PCB area corresponding to each added passive component. In some cases electronic design is sub-optimized by eliminating some passives due to footprint constraints. Cost is increased by the need for a reflow step in module assembly.

In the current art, footprint area is sometimes decreased by using the smallest surface mount devices ("SMD") possible, using packaging that combines several passives into one package, and making cost/area/performance tradeoffs by eliminating passives that, while they may improve the quality of the electronic design, are not strictly required.

In some constructions, stacked dies (individual integrated circuits stacked one upon the other) are used to minimize footprint area. With stacked dies, wire bonding is typically done independently for each die. That is, each die is wire bonded to the substrate, which can result in long bond wires, aggravating wire wash (bowed wires due to the flow of plastic in injection molding process) and adding inductance. Occasionally, stacked dies are bonded from die to die, requiring both dies to be designed with bond pad placements to accommodate the sister die's needs. Stacked dies are not an option with camera sensor chips, in that the sensor matrix must be exposed to a lens.

Current construction methods require additional footprint area as components external to semiconductor dies are added. Also, it may not be possible, due to mechanical constraints or simply too many components, to place all of them optimally, for example to place filtering components close to power and ground pins. This may diminish noise-reducing effectiveness.

What is needed is a method for connecting components associated with a semiconductor die wherein the components are optimally placed, requiring little or no additional area upon the system printed circuit board or substrate.

SUMMARY

A SMD component is attached to the surface of a semiconductor die by an adhesive. The component is electrically connected to the semiconductor die and/or a substrate by various means, examples including wire bonding and conductive epoxy. Bond wires are shorter (or nonexistent), components are located closer to the desired point of effectiveness, and no substrate area is needed.

DESCRIPTION OF SOME EMBODIMENTS

Figure 1:
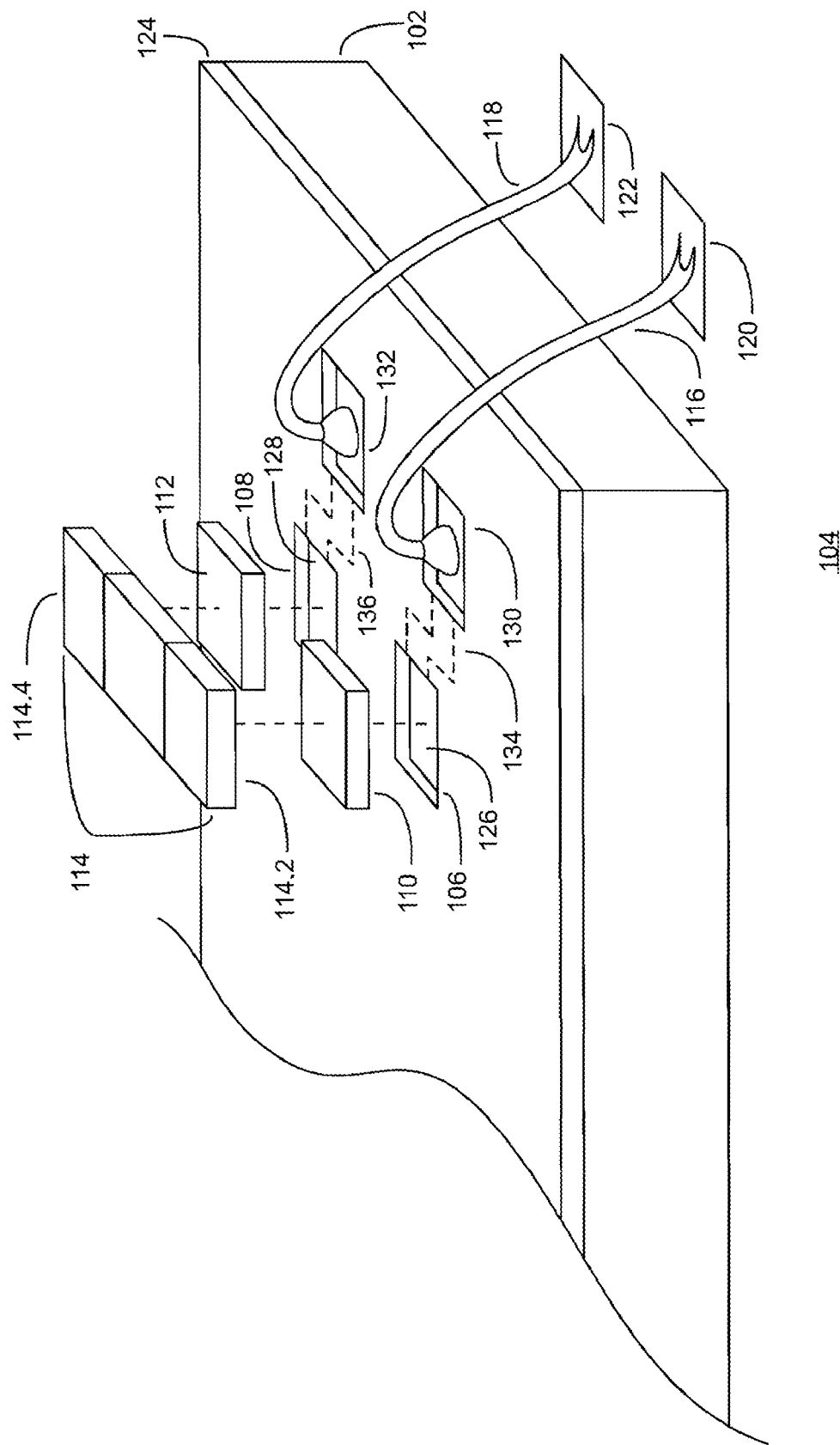
FIG. 1 illustrates an external component physically attached and electrically connected to a semiconductor die.

| | Definition of terms: |
|---|---|
| PCB | Printed circuit board. In the context of this disclosure, may also refer to "substrate". |
| Footprint | The area of a PCB board covered by an individual component attached to the PCB. |
| TAB | Tab Automated Bonding, a method of making an electrical connection between a semiconductor bond pad and a conductive pad on a substrate. |
| SMD | Surface mount device; an electrical component that is mounted directly upon a conducting surface as opposed to a wire lead in a receiving hole. |
| IR | Infrared energy, often used for reflowing solder paste. |
| BOB | Bond On Bond; a technique for attaching a wire bond end to a pre-existing wire bond end. Sometimes called "Bond on ball". |

The embodiments described in this section illustrate but do not limit the invention. The invention is not limited to any particular circuitry, semiconductor process, adhesive materials, attachment technique, bonding method, or other parameters.

Semiconductor dies are usually capped by a top layer of passivation material, for example silicon nitride, to protect the die from damage during handling and to provide a barrier against moisture and contamination. Openings are made over certain conducting areas (termed "bond pads") to allow for electrically connecting the die bond pads to another connecting point, typically a bond pad on a substrate to which the die has been affixed. In many electronic assemblies, a die is not further encapsulated but is attached directly to a substrate by an adhesive. Conductors, such as wires, are attached by various means between bond pads on the semiconductor die and bond pads on the substrate. External components, such as capacitors, resistors, transistors, logic gates, and the like are affixed elsewhere on the substrate, appropriately connected electrically to connection points, the electrical connection points being connected electrically to the die by conductive lines, for example copper lines or conductive ink. The external components and their associated connectors and conducting lines add incrementally to the area required for the substrate.

In accordance with the present invention, an external component (that is, a component not manufactured in situ with the semiconductor die) is attached to the top surface of a semiconductor die. In some embodiments, the semiconductor die is formed with certain connection points in a predetermined location, the predetermined location determining the location and orientation of an external component relative to the semiconductor die and the manner in which the external component is electrically connected to the semiconductor die. In other embodiments, an external component is more arbitrarily located (and attached) and electrically attached by a method that does not require a specific placement point or orientation of the external component. In some embodiments, the external components include gold plated terminating ends.

The drawings in this disclosure show the structure of example embodiments. The structure will be described from top to bottom with the structure oriented horizontally as shown. It should be understood, however, that the structure of this invention will be oriented in an arbitrary direction when placed into an application. Therefore, any reference to a top or bottom surface or structure is to be understood to refer only to these surfaces and structures as oriented in the drawings and not in the context of the use of this structure.

In an exemplary method, an external component is affixed to the topmost layer of a semiconductor die. Many arrangements for doing so are practical; certain examples are described herein but are not exhaustive, and all such embodiments are to be considered as in accordance with the present invention. For example, referring to FIG. 1, a semiconductor die 102 is attached to a substrate 104. A passivation layer 124 has one or more openings, for example openings 106 and 108, each such opening positioned above a conducting bond pad, for example bond pad 126 and bond pad 128. A component 114, for example a surface mount device ("SMD") such as a resistor or capacitor, is to be connected electrically between the bond pads 126, 128. A conductive adhesive 110, 112 physically and electrically attaches the contacts 114.2, 114.4 of the component 114 to the bond pads 126, 128. In some embodiments, the conductive adhesive 110, 112 is a conductive tape, for example 3M™ Z-AXIS ELECTRICALLY CONDUCTIVE TAPE 9703. In another embodiment, the conductive adhesive is metal-filled epoxy, for example ABLEBOND 84-1LMI ELECTRICALLY CONDUCTIVE EPOXY (available from National Starch & Chemical Company, Bridgewater, N.J.) similar to a conductive adhesive used for die attach. Any suitable conductive adhesive could be used. In some embodiments, the semiconductor die is manufactured using "bump pads", a common die manufacturing method wherein the bond pads are provided with an extra conducting bump. An external component is then attached to the bumped pad(s) using an ultrasonic process, the ultrasonic process briefly heating and melting the bump material such that the component contacts 114.2, 114.4 are electrically and mechanically connected to the bond pads 124, 126 when the bump material cools.

In one embodiment, the external component 114 is further electrically connected to terminals on a substrate, for example bond pads 120, 122. The bond pads 126, 128 electrically connect to wire bond pads 130, 132 by signal lines 134, 136 wherein the bond pads 126, 128, signal conducting lines 134, 136, and wire bond pads 130, 132 are formed on the semiconductor die 102 during the manufacture of the semiconductor die 102. Wire bond pads 130, 132 may be connected to substrate bond pads 120, 122 by conducting material, for example bond wires 116, 118. In some embodiments, wires 116, 118 are replaced by the use of TAB bonding or other means for electrically connecting signals from wire bond pads 130, 132 to substrate bond pads 120, 122. In one embodiment, the component 114 is wired bonded directly to substrate bond pads 120, 122.

Figure 2:
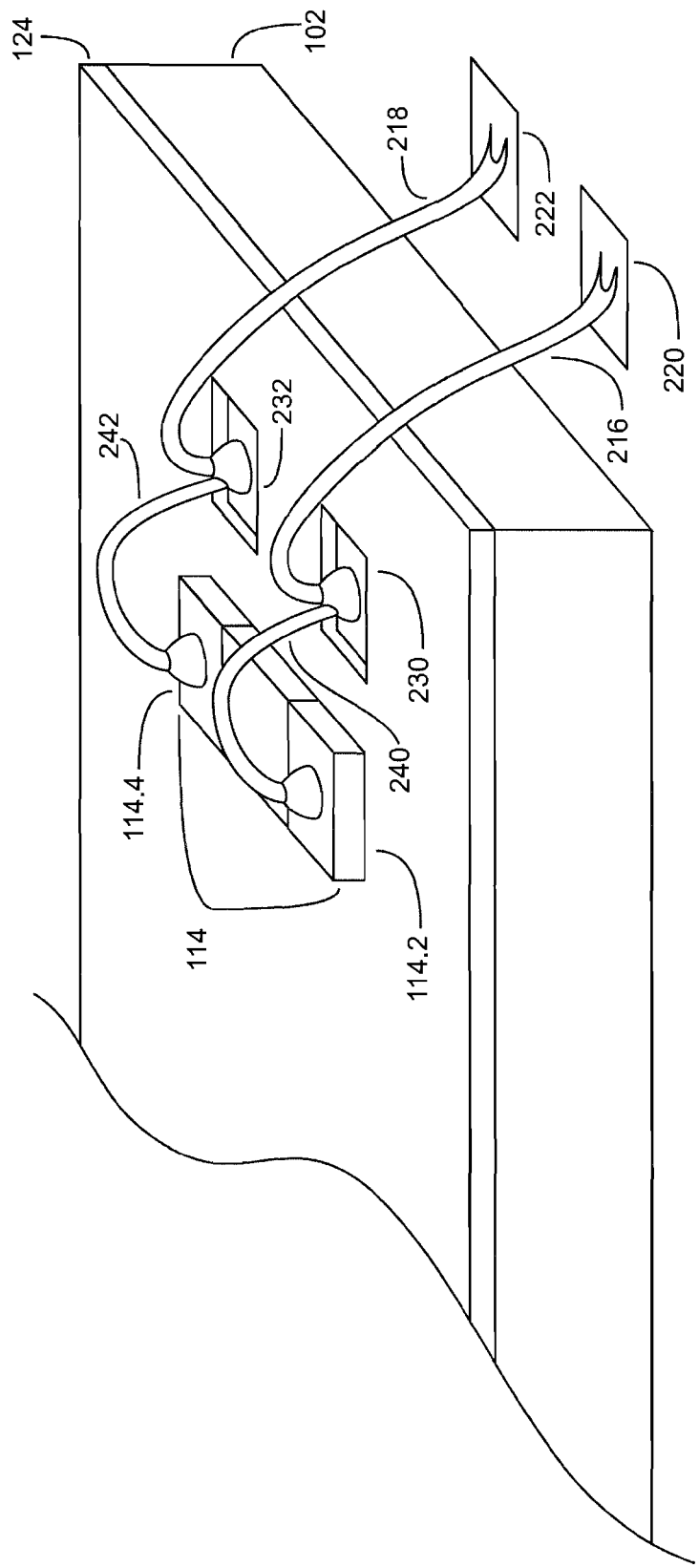
FIG. 2 illustrates an external component physically attached and electrically connected to a semiconductor die in accordance with another embodiment, wherein the external component placement is arbitrary.
Figure 4:
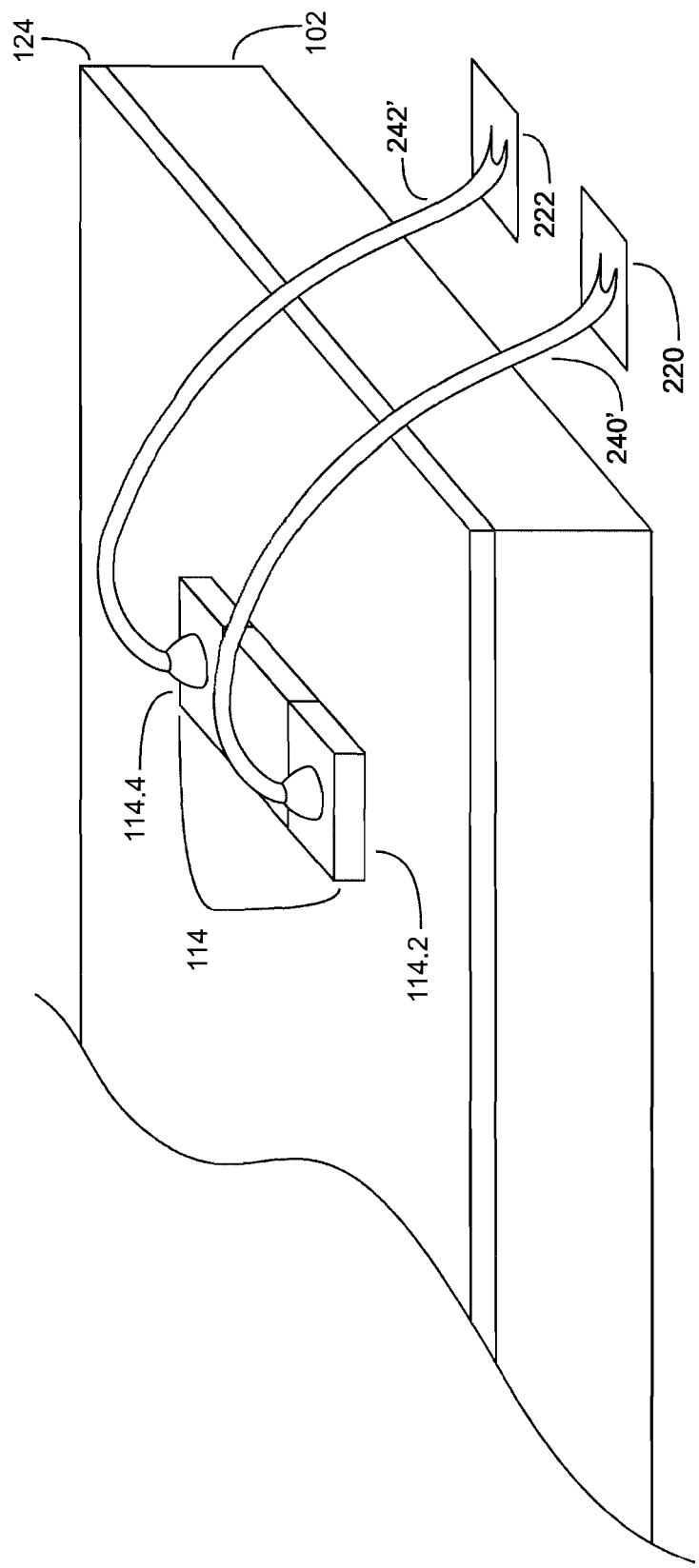
FIG. 4 illustrates an external component physically attached and electrically connected to a semiconductor die.

In another embodiment, illustrated by FIG. 2, a component 114 is affixed to the passivation layer 124 by a non-conducting adhesive, for example by epoxy such as ABLEBOND 961-4 (available from National Starch & Chemical Company, Bridgewater, N.J.) cyanoacrylate glue, or double-stick tape. Wires 240, 242 are bonded to the conductive ends 114.2, 114.4 of the component 114. In one embodiment, wires 240', 242' are bonded between the component ends 114.2, 144.4 and the substrate bond pads 220, 222 (illustrated in FIG. 4). In some embodiments, the wires 240, 242 are bonded between the component ends 114.2, 114.4 and wire bond pads 230, 232 on the semiconductor die 102. In some embodiments, the component 114 is wire bonded to bond pads 230, 232 and bond pads 230, 232 are further bonded to bond pads 220, 222. The component 114 may be arbitrarily located, and existing semiconductor dies may benefit from the method of the present invention without being altered to accommodate placement of the component 114.

Referring again to FIG. 2, close proximity of the component 114 to the bond pads 230, 232 may improve the electrical performance of the semiconductor 102. For example, in one embodiment, the component 114 is a decoupling capacitor between power and ground, wherein the signal on one of the wire bond pads 230 or 232 is power and the signal on the other wire bond pad is a ground signal. In the relevant art, a long signal path from wire bond pad 230,232 (130, 132) to substrate bond pad 220, 222 (120, 122) through signal lines to the printed circuit board to a decoupling capacitor (not shown) increases the inductance across the power and ground input terminals of the semiconductor die, contributing to ringing and noise (as well as increasing footprint area). In one embodiment, one or more decoupling capacitors is located and electrically connected within the interior of the semiconductor die, not just at the exterior power pins. The invention may also be used to provide resistance, capacitance, and/or inductance values within a semiconductor die that would be impractical to instantiate within a die design.

In the relevant art, a system designer must take care to match the lengths of related signal lines. A system constructed as described herein provides for minimum wire lengths, hence minimum inductance, and matching signal lines is no longer a consideration. Additional cost benefit may be derived from fewer process steps in the manufacture of the PCB-based system. For example, SMD components on a PCB are typically temporarily attached with solder paste, then the assembly is exposed to high temperature, such as from an oven or IR heating, to reflow the solder paste. With the method described herein, reflow is not needed.

The component 114 may be any SMD required for the end design. The component 114 may be placed at nearly any location relative to the semiconductor die 102, avoiding any areas where the component 114 may present a problem. For example, optical sensing semiconductors are top coated with a color filter array film to which a SMD passive may be attached by an adhesive. The SMD may be bonded to by wire bond or BOB methods. Optical dies are usually core limited, leaving a significant area surrounding the optical sensing matrix, providing adequate area to which the SMD may be attached. Using clean-room die attach equipment to apply epoxy, then affixing the SMD, eliminates the need for a lead free reflow process step, saving the cost of that step as well as lowering the yield loss and reliability issues associated with the reflow step. With optical sensing dies, the area above the die when attached to the substrate is below a cavity provided by the carrier for the lens, thus the die-attached SMD essentially requires zero area or Z-axis increase.

Figure 3:
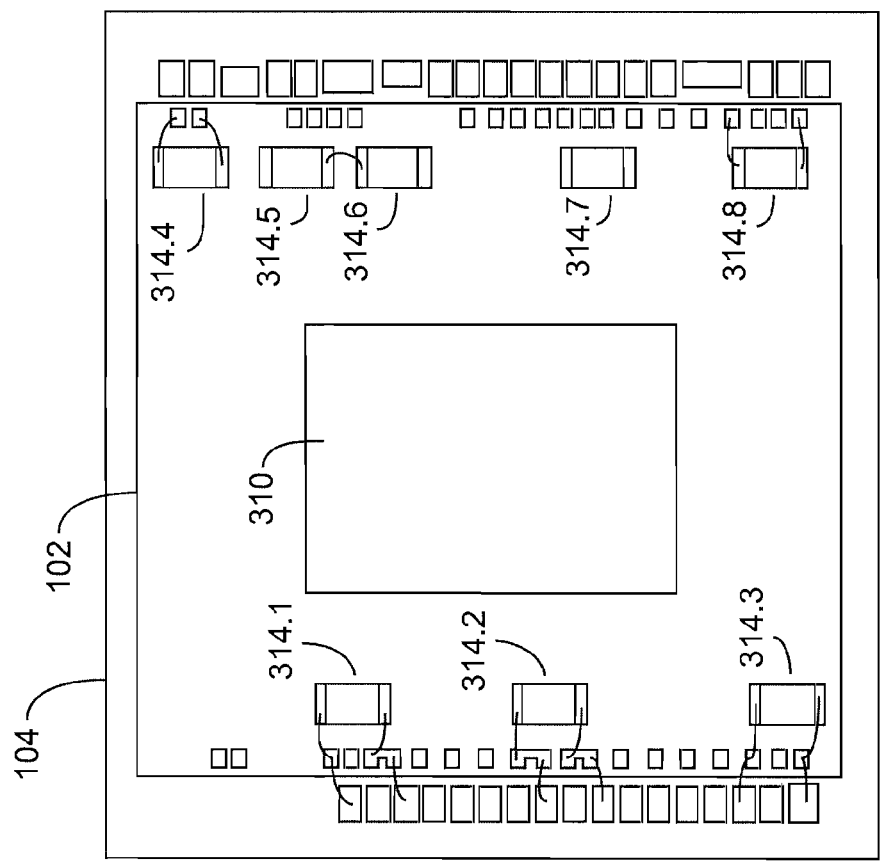
FIG. 3 shows a semiconductor die with a plurality of passive components attached.

FIG. 3 is an example of an optical sensor with a plurality of passive components attached in accordance with the present invention. Shown are eight passive components (314.1 through 314.8) attached to the surface of a semiconductor die 102. An optically active matrix 310 is not covered by any attached components 314.*n*. The figure includes an example of a passive 314.4 wire bonded to two bond pads on semiconductor die 102. Also shown is an example of two attached components 314.5, 314.6 wire bonded together. Also shown is an example 314.3 wherein a bond on ball bond is used. Component 314.7 is an example of an external component 114 attached through underlying openings 106, 108 to exposed bond pads 126, 128 (not shown) of semiconductor 102, hence no bond wires are needed.

The process for assembling the structure comprises attaching a semiconductor die 102 to a substrate 104, typically using a conductive epoxy applied to at least a portion of the lower surface of the semiconductor die 102. In some embodiments, the semiconductor 102/substrate 104 sandwich is cured using heat or other suitable means. In other embodiments, the semiconductor 102/substrate 104 sandwich is not cured until after the external component 114, 314 is attached to the semiconductor 102. In other embodiments, the external component 114, 314 is attached to the semiconductor 102, prior to or at the same time that the semiconductor 102 is attached to the substrate 104. Adhesive or conductive tape may be applied to at least a portion of an external component 114, 314 and the external component positioned over and attached to an upper surface of the semiconductor die 102. For embodiments wherein the component 114, 314 is to be electrically connected to the semiconductor die 102 with conductive adhesive, the component is positioned over a corresponding opening in the top protective layer of the semiconductor die 102. For embodiments wherein the component 114 is to be wire bonded to the semiconductor die 102, a non-conductive adhesive may be applied to at least a portion of the lower surface of the component and the component placed on the top surface of the semiconductor die 102. The sandwich of substrate 102, semiconductor die 102, and component 114 may then be cured as specified by the maker of the adhesive. Note that a plurality of components 114, 314 may be attached to the semiconductor die 102. In some embodiments, one or more components 114 is attached directly exposed pads on the semiconductor die 102.

RESERVATION OF EXTRA-PATENT RIGHTS. RESOLUTION OF CONFLICTS, AND INTERPRETATION OF TERMS

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Given the above disclosure of general concepts and specific embodiments, the scope of protection sought is to be defined by the claims appended hereto. The issued claims are not to be taken as limiting Applicant's right to claims disclosed, but not yet literally claimed subject matter by way of one or more further applications including those filed pursuant to 35 U.S.C. §120 and/or 35 U.S.C. §251.

Unless expressly stated otherwise herein, ordinary terms have their corresponding ordinary meanings within the respective contexts of their presentations, and ordinary terms of art have their corresponding regular meanings

What is claimed is:

1. A method of making an electronic component, comprising:
providing a substrate, including a surface and a pair of electrical terminals;
providing a semiconductor die including a first surface, a second surface, and a pair of electrical terminals, wherein the semiconductor die is an optical sensing die that comprises an integral optically active matrix, wherein the integral optically active matrix is part of the second surface of the die;
providing a first electronic component including a surface and a pair of electrical terminals;
attaching the surface of the first electronic component to the second surface of the semiconductor die between an edge of the second surface of the semiconductor die and the integral optically active matrix;
attaching the first surface of the semiconductor die to the surface of the substrate; and
electrically connecting at least one of the pair of electrical terminals of the first electronic component to at least one of the semiconductor die and the substrate.

2. The method as defined in claim 1, wherein the first electronic component is a passive electronic component.

3. The method as defined in claim 2, wherein the passive component is a Surface Mount Device (SMD), and wherein the passive component is one of a resistor and a capacitor.

4. The method as defined in claim 3, further comprising providing a cavity for a lens above the integral optically active matrix.

5. The method as defined in claim 1, further comprising:
providing a second electronic component including a surface and a pair of electrical terminals;
attaching the surface of the second electronic component to the second surface of the semiconductor die between the edge of the second surface of the semiconductor die and the integral optically active matrix; and
electrically connecting at least one of the pair of electrical terminals of the second electronic component to at least one of the semiconductor die and the substrate.

6. The method as defined in claim 5, further comprising electrically connecting one of the electrical terminals of the first electronic component directly to one of the electrical terminals of the second electronic component.

7. The method of claim 5, wherein the first electronic component is a SMD, wherein electrically connecting at least one of the pair of electrical terminals of the first electronic component to at least one of the semiconductor die and the substrate comprises wirebonding between at least one of the pair of electrical terminals of the first electronic component and at least one of the semiconductor die and the substrate.

8. The method as defined in claim 7, further comprising providing a cavity for a lens above the integral optically active matrix.

9. The method as defined in claim 7, further comprising:
applying, prior to the attaching the surface of the first electronic component step, an adhesive to at least one of the surface of the first electronic component and the second surface of the semiconductor die such that the adhesive is disposed between the surface of the first electronic component and the second surface of the semiconductor die after the attaching the surface of the first electronic component step; and providing heat to the combined structure of the first electronic component and the semiconductor die to cure the adhesive.

10. The method as defined in claim 9, further comprising providing a cavity for a lens above the integral optically active matrix.

11. The method as defined in claim 1, further comprising providing a cavity for a lens above the integral optically active matrix.

* * * * *